US007948809B2

(12) United States Patent
Miki

(10) Patent No.: US 7,948,809 B2
(45) Date of Patent: May 24, 2011

(54) REGULATOR AND SEMICONDUCTOR DEVICE

(75) Inventor: Atsunori Miki, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 125 days.

(21) Appl. No.: 12/458,623

(22) Filed: Jul. 17, 2009

(65) Prior Publication Data

US 2010/0013449 A1 Jan. 21, 2010

(30) Foreign Application Priority Data

Jul. 18, 2008 (JP) ................................ 2008-187084

(51) Int. Cl.
*G11C 5/14* (2006.01)

(52) U.S. Cl. .................... 365/189.09; 365/226; 365/203

(58) Field of Classification Search ............. 365/189.09, 365/226, 203, 185.2, 207, 205, 194, 210.1, 365/185.21, 208, 201, 189.01
See application file for complete search history.

(56) References Cited

U.S. PATENT DOCUMENTS

| | | | | |
|---|---|---|---|---|
| 5,910,924 | A | 6/1999 | Tanaka et al. | |
| 7,826,284 | B2 * | 11/2010 | La Placa et al. | 365/196 |
| 2006/0158946 | A1 * | 7/2006 | Taddeo | 365/208 |

FOREIGN PATENT DOCUMENTS

| | | |
|---|---|---|
| JP | 10-64261 | 3/1998 |

* cited by examiner

*Primary Examiner* — Dang T Nguyen
(74) *Attorney, Agent, or Firm* — McGinn IP Law Group, PLLC

(57) ABSTRACT

Disclosed is a regulator including: a differential amplifier having a differential input stage receiving a reference voltage and an output terminal voltage, a push-pull type output portion of a current mirror configuration, a drive transistor having a control terminal connected to an output portion of the differential amplifier, first and second transistors cascode-connected between a control terminal of the drive transistor and a power supply, and third and fourth transistors cascode-connected between the control terminal of the drive transistor and ground. Control terminals of the first and the third transistors are respectively connected to control terminals of the push-pull transistors, control terminals of the second and fourth transistors are respectively connected to a first and a second control signal. A voltage of the control terminal of the drive transistor is controlled, based on the first and the second control signals, by output of the differential amplifier and the first transistor, or by output of the differential amplifier and the third transistor.

11 Claims, 10 Drawing Sheets

REGULATOR AND SEMICONDUCTOR DEVICE

REFERENCE TO RELATED APPLICATION

This application is based upon and claims the benefit of the priority of Japanese patent application No. 2008-187084 filed on Jul. 18, 2008, the disclosure of which is incorporated herein in its entirety by reference thereto.

TECHNICAL FIELD

The present invention relates to a regulator for generating an internal voltage of a semiconductor device from a power supply voltage.

BACKGROUND

In Patent Document 1, there is disclosed a voltage conversion circuit (regulator) including a differential amplifier with a push-pull output structure of a current mirror configuration. In order to describe the voltage conversion circuit in Patent Document 1, FIG. 10 is created based on FIG. 1 of Patent Document 1. Referring to FIG. 10, the voltage conversion circuit includes an error amplifier that is configured as a differential amplifier and that outputs error amplification output to a node N1, and a buffer circuit that receives the output from the error amplifier and outputs an output voltage Vout3 to a node N2. The differential amplifier as the error amplifier includes a differential input stage and a push-pull type output unit of a current mirror circuit configuration.

In more detail, referring to FIG. 10, the differential input stage of the differential amplifier includes:

an n-channel MOS transistor (current source transistor) Q9 that has a source connected to GND (ground) and has a gate to which a bias voltage BN I supplied;

a differential pair including:

n-channel MOS transistors Q1 and Q2 that have sources coupled together and connected to a drain of the current source transistor Q9; and diode-connected p-channel MOS transistors Q3 and Q5 that have sources connected in common to a power supply terminal VDD, and have drains respectively connected to drains of the transistors Q1 and Q2.

The differential amplifier output portion (push-pull type output portion of the current mirror circuit configuration) includes:

a p-channel MOS transistor Q4 that has a source connected to the power supply terminal VDD and has a gate connected to a gate of the p-channel MOS transistor Q3;

a p-channel MOS transistor Q6 that has a source connected to the power supply terminal VDD and has a gate connected to a gate of the p-channel MOS transistor Q5;

an n-channel MOS transistor Q7 that has a source connected to ground and has a drain and a gate connected to a drain of the p-channel MOS transistor Q4; and an n-channel MOS transistor Q8 that has a source connected to GND, has a gate connected to a gate of the n-channel MOS transistor Q7, and has a drain connected to a drain of the transistor Q6. The transistors Q8 and Q6 compose push-pull transistors. The p-channel MOS transistors Q3 and Q4 compose a first current mirror circuit, the p-channel MOS transistors Q5 and Q6 compose a second current mirror circuit, and the n-channel MOS transistors Q7 and Q8 form a compose third current mirror circuit.

A reference voltage Vref is supplied from a reference voltage generation circuit (not shown), to the gate of the n-channel MOS transistor Q1 constituting the differential pair, and an output Vout3 of the buffer circuit is fed back to a gate of the n-channel MOS transistor Q2. The bias voltage BN (denoted as F1 in Patent Document 1) is supplied from a bias circuit (not shown) to a gate of the current source transistor Q9.

The buffer circuit includes:

a p-channel MOS transistor (drive transistor) Q10 that has a source connected to a power supply terminal VDD, has a gate connected to a node N1 (output of differential amplifier output portion), and has a drain connected to a node N2 (regulator output); and a resistance element R1 between the node N2 and GND. In Patent Document 1, the resistance element R1 between the node N2 and GND includes an n-channel MOS transistor (not shown in FIG. 10) that has a source connected to GND, has a drain connected to the node N2, and has a gate to which a bias voltage is supplied. This n-channel MOS transistor is arranged such that a current source is configured so that a current (idling current) of an appropriate amount flows in the drive transistor Q10 even when a load current I3 becomes particularly small.

The drive transistor Q10 is in an operation state so as to have an appropriate gain, irrespective of large amount of change in the load current I3 due to this idling current. In Patent Document 1, there is provided a p-channel MOS transistor (control transistor) (not shown in FIG. 10) that has a source connected to the power supply terminal VDD, has a gate connected to a bias voltage, and has a drain connected to the node N1. This control transistor is provided so that, by switch-controlling the gate bias voltage BN (F1 in Patent Document 1) of the current source transistor Q9 to 0V, when operation of the voltage conversion circuit is stopped, synchronization thereto is performed, and the drive transistor Q10 is preferably cut off.

In the configuration of FIG. 10, the amount of current flowing to the push-pull type output portion transistors Q6 and Q8, is adjusted by the differential input stage and the current mirror circuit and the gate potential of the drive transistor Q10 is able to be lowered to almost a GND potential. It is possible to increase gate-to-source voltage of the drive transistor Q10, and to increase drive capability of the buffer circuit (drive transistor Q10).

[Patent Document 1]

JP Patent Kokai Publication No. JP-A-10-64261

SUMMARY

The entire disclosure of Patent Document 1 is incorporated herein by reference thereto.

An analysis of the related art according to the present invention is given as follows.

In recent years with regard to large capacity memory and so forth, an output load current of a regulator tends to increase in order to achieve high speed access. In particular, response speed of the regulator to a transient increase in the load current immediately after memory access is important.

When the response speed of the regulator is not sufficient, there is a concern regarding the occurrence of:

output potential drop immediately after memory access;

erroneous judgment due to over precharging after memory access;

operation margin decrease; and overstress.

Therefore, it is important to increase drive capability of a drive transistor of a regulator in lowering the power supply voltage and a higher response speed of the regulator is also required.

In the configuration described with reference to FIG. 10, when the response speed of the regulator is raised against the transient increase in the load current immediately after memory access, current consumption increases. This point will be described below.

In FIG. 10, a current flowing in a path of the transistors Q6 and Q8 of the push-pull type output portion of the differential amplifier is determined by a current flowing in the current source transistor Q9, or a mirror ratio (ratio of transistor dimensions) of a current mirror circuit. In the differential amplifier, a current flowing in the current source transistor Q9 is constant (constant current). With regard to the response speed of the regulator against a transient increase in load current immediately after memory access, adjustment is necessary by increasing operation current (that is, current of the current source transistor Q9) of the regulator so that current consumption increases.

For example, in increasing output current (drain current) of the drive transistor Q10 for a transient increase in the load current I3, it is necessary to pull down a gate potential of the drive transistor Q10 to a GND potential. Here, in discharging the gate of the drive transistor Q10 in order to pull down the gate potential to the GND potential at high speed, it is necessary to increase a drain current of the n-channel MOS transistor Q8 of the push-pull type output portion. The drain current of the n-channel MOS transistor Q8 is a mirror current of the a drain current of the n-channel MOS transistor Q7, and the drain current of the n-channel MOS transistor Q7 is equal to a drain current of the p-channel MOS transistor Q4 (which is a mirror current of a drain current of the p-channel MOS transistor Q3. In order to discharge the gate node N1 of the drive transistor Q10 at high speed, it is necessary to increase the current value of the current source transistor Q9. This increases current consumption.

Accordingly, it is an object of the present invention to provide a regulator that enables a high speed response and enables to keep an output stable, against a transient increase in an output load current, without increasing current consumption.

In order to solve one or more of the abovementioned problems, the present invention disclosed herein is configured in outline as follows.

According to a first aspect of the present invention, there is provided a regulator including: a differential amplifier including a differential input stage that differentially receives a reference voltage and an output terminal voltage of the regulator; a drive transistor that has an output connected to an output terminal of the regulator and that has a control terminal connected to an output of the differential amplifier; first and second transistors connected in series between the control terminal of the drive transistor and a first power supply terminal; and third and fourth transistors connected in series between the control terminal of the drive transistor and a second power supply terminal. A control terminal of the first transistor and a control terminal of the third transistor are directly or indirectly connected to outputs of the differential input stage and a control terminal of the second transistor and a control terminal of the fourth transistor are connected to a first control signal and a second control signal, respectively. The second transistor is on-off controlled by the first control signal and the fourth transistor is on-off controlled by the second transistor. In the present invention, a control terminal voltage of the drive transistor is controlled, based on the first and the second control signals, by output of the differential amplifier, or by output of the differential amplifier and the first transistor, or by output of the differential amplifier and the third transistor.

According to the present invention, it is possible to speed up a response and to maintain a stable output voltage, against a transient increase in an output load current, without increasing current consumption.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

In accordance with the present invention, a regulator includes:

a differential amplifier having differential inputs connected to a reference voltage (Vref) and an output terminal voltage (Vout1);

a drive transistor (Q10) that has an output connected to an output terminal of a regulator and has a control terminal (N1) connected to an output of the differential amplifier and that has an output current controlled by a voltage at the control terminal (N1);

first and second transistors (Q11 and Q12) cascode-connected between the control terminal (N1) of the drive transistor (Q10) and a first power supply terminal (GND); and third and fourth transistors (Q13 and Q14) cascode-connected between the control terminal (N1) of the drive transistor (Q10) and a second power supply terminal (VDD).

The differential amplifier has a differential input stage including:

a current source Q9;

a differential pair (Q1 and Q2), and loads (Q3 and Q5).

The differential amplifier includes the differential input stage and a differential amplifier output portion with a push-pull output structure of a current mirror configuration (Q4, Q7, Q8, and Q6).

The control terminal of the first transistor (Q11) is indirectly (for example, indirectly via the transistors Q3, Q4, Q7, and Q8) connected to an output of the differential input stage (an output of the differential pair transistor (Q1)).

The control terminal of the third transistor (Q13) is directly connected to an output of the differential input stage (the output of the differential pair transistor (Q2)).

The control terminals of the second and fourth transistors (Q12 and Q14) are respectively connected to first and second control signals (IN1 and IN2).

When the control terminal voltage of the drive transistor (Q10) is changed to the first power supply voltage (GND), the first control signal (IN1) is activated to turn on the second transistor (Q12), and the control terminal voltage of the drive transistor (Q10) is changed to the first power supply voltage (GND) side, by the output of the differential amplifier (an output of the transistor Q8) and the first transistor (Q11). When the control terminal voltage of the drive transistor (Q10) is changed to the second power supply voltage (VDD), the second control signal (IN2) is activated to turn on the fourth transistor (Q14), and the control terminal voltage of the drive transistor (Q10) is changed to the second power supply voltage (VDD) side, by the output of the differential amplifier (an output of the transistor Q6) and the third transistor (Q13). A description will be given below according to exemplary embodiments.

Figure 1:
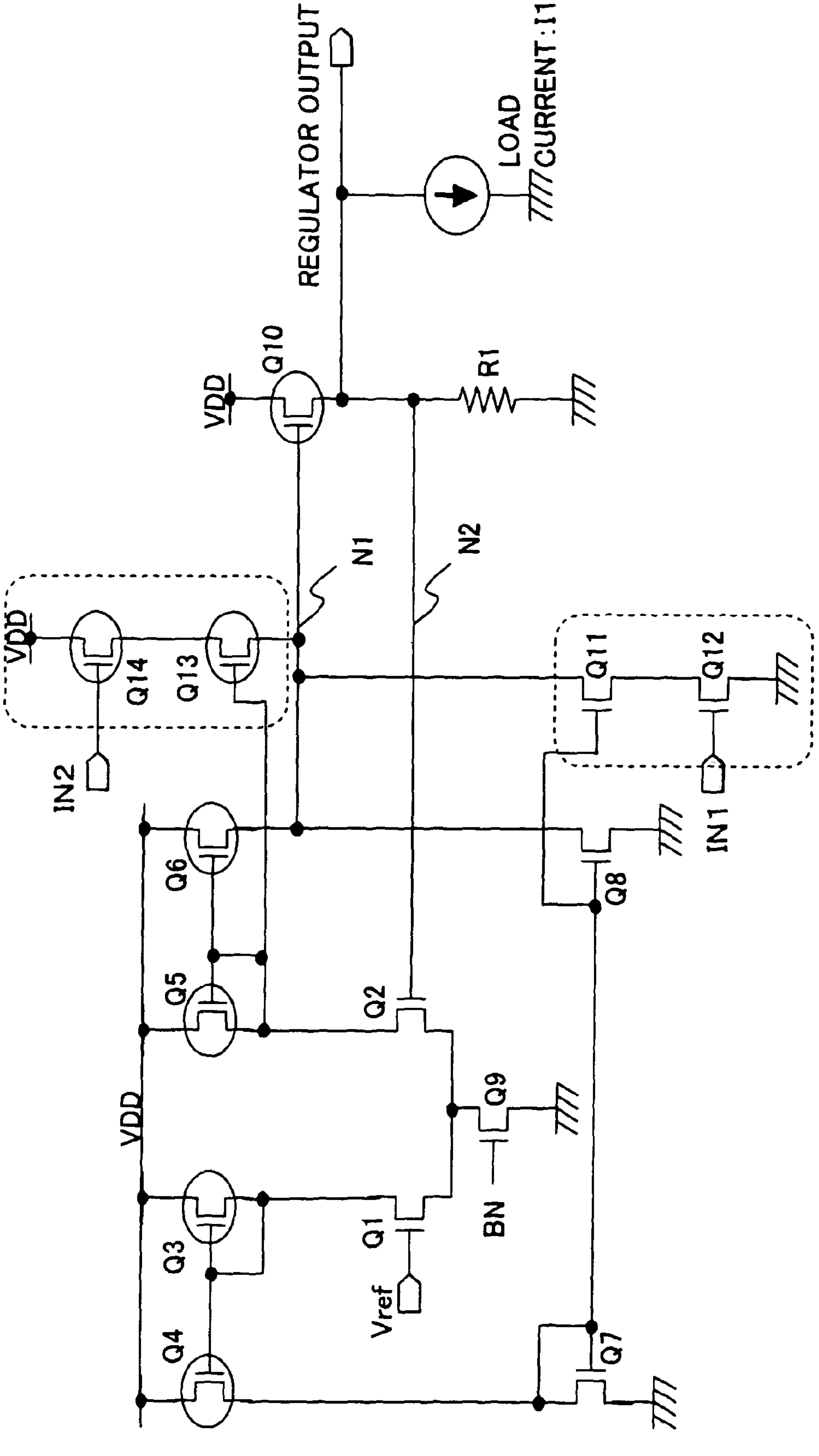
FIG. 1 is a diagram showing a configuration of a first exemplary embodiment of a regulator of the present invention.

FIG. 1 is a diagram showing a configuration of a regulator of a first exemplary embodiment of the present invention. In the present exemplary embodiment, the regulator includes a differential amplifier as an error amplifier, similar to FIG. 10, and a buffer circuit. The differential amplifier includes a differential input stage, and a push-pull type output portion of a current mirror configuration.

In FIG. 1, the differential input stage of the differential amplifier includes:

an n-channel MOS transistor (current source transistor) Q9 that has a source connected to GND, and has a gate to which a bias voltage BN is supplied;

a differential pair including n-channel MOS transistors Q1 and Q2 that have sources coupled and connected to a drain of the current source transistor Q9; and diode-connected p-channel MOS transistors Q3 and Q5 that have sources are connected in common to a power supply terminal VDD, and have drains respectively connected to drains of the transistors Q1 and Q2.

The differential amplifier output portion (push-pull type output portion of the current mirror circuit configuration) includes:

a p-channel MOS transistor Q4 that has a source connected to the power supply terminal VDD and has a gate connected to a gate of the p-channel MOS transistor Q3;

a p-channel MOS transistor Q6 that has a source connected to the power supply terminal VDD and has a gate connected to a gate of the p-channel MOS transistor Q5;

an n-channel MOS transistor Q7 that has a source connected to GND and has a drain and a gate connected to a drain of the p-channel MOS transistor Q4; and an n-channel MOS transistor Q8 that has a source connected to GND, has a gate connected to a gate of the n-channel MOS transistor Q7, and has a drain connected to a drain of the transistor Q6. The transistors Q8 and Q6 compose push-pull transistors. The p-channel MOS transistors Q3 and Q4 compose first current mirror circuit, the p-channel MOS transistors Q5 and Q6 compose a second current mirror circuit, and the n-channel MOS transistors Q7 and Q8 compose a third current mirror circuit.

A reference voltage Vref is supplied from a reference voltage generation circuit (not shown), to the gate of the n-channel MOS transistor Q1, constituting the differential pair, and a regulator output Vout1 is fed back to a gate of the n-channel MOS transistor Q2.

The bias voltage BN is supplied from a bias circuit (not shown) to a gate of the current source transistor Q9.

The buffer circuit includes:

a p-channel MOS transistor (drive transistor) Q10 that has a source connected to the power supply terminal VDD, has a gate connected to a node N1 (output of differential amplifier output portion), and has a drain connected to a node N2 (output of regulator); and a resistance element R1 between the node N2 and GND.

Figure 10:
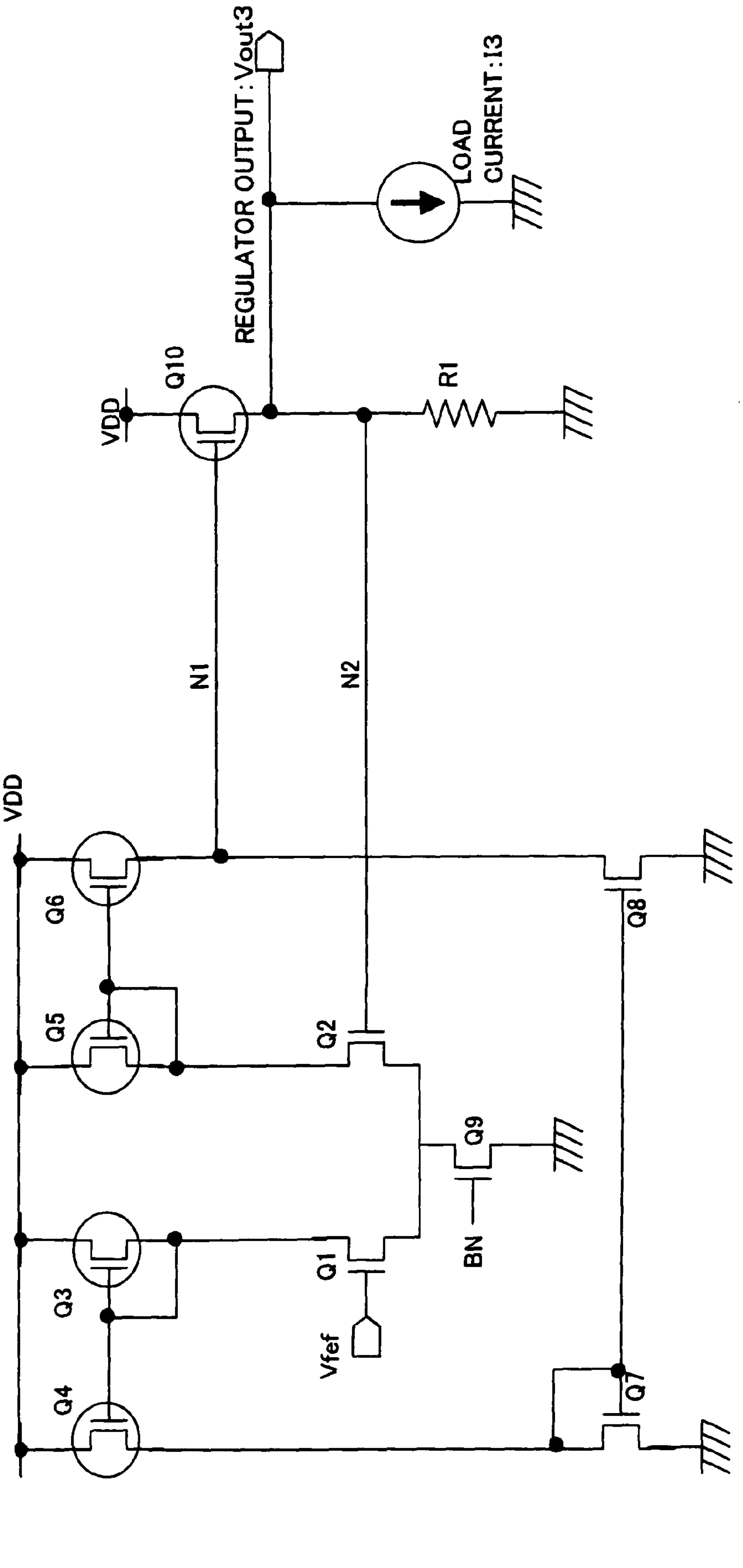
FIG. 10 is a diagram showing a configuration of a regulator of related art.

In FIG. 1, the abovementioned current source transistor Q9, the n-channel MOS transistors (differential pair) Q1 and Q2, the p-channel MOS transistors (load circuits) Q3 and Q5, the p-channel MOS transistor Q4 composing a first current mirror circuit with the p-channel MOS transistor Q3, the p-channel MOS transistor Q6 composing a second current mirror circuit with the p-channel MOS transistor Q5, the n-channel MOS transistors Q7 and Q8 composing a third current mirror circuit, and the drive transistor Q10 that composes the buffer circuit are basically the same, respectively, as the transistors of the same reference symbols in FIG. 10.

Referring to FIG. 1, in the regulator of the present exemplary embodiment, n-channel MOS transistors Q11 and Q12, and p-channel MOS transistors Q13 and Q14 are added as compare with the configuration of FIG. 10.

The n-channel MOS transistor Q11 has a drain connected to the node N1, and has a gate connected to a common connection node of the drain and the gate of the n-channel MOS transistor Q7, and the gate of the n-channel MOS transistor Q8.

The n-channel MOS transistor Q12 has a source connected to a GND terminal, and has a gate supplied with a first driver control signal IN1, and has a drain connected to a source of the n-channel MOS transistor Q11.

The p-channel MOS transistor Q13 has a drain connected to the node N1, and has a gate thereof connected to a common connection node of the drain and the gate of the p-channel MOS transistor Q5, and the gate of the p-channel MOS transistor Q6. That is, the gate of the p-channel MOS transistor Q13 is directly connected to one differential output of the differential input stage (a drain of the transistor Q5). The gate of the n-channel MOS transistor Q11 is indirectly connected, via the current mirror circuits (Q3, Q4, Q7, and Q8) to the other differential output of the differential input stage (a drain of the transistor Q3).

The p-channel MOS transistor Q14 has a source connected to the power supply terminal VDD, has a gate thereof connected to a second driver control signal IN2, and has a drain connected to a source of the p-channel MOS transistor Q13.

The n-channel MOS transistors Q11 and Q12, which are cascode-connected between the node N1 and a GND terminal, operate so as to equivalently increase the size (drive capability) of the n-channel MOS transistor Q8 of the differential amplifier output portion, which shifts the potential of the node N1 to a GND side.

The p-channel MOS transistors Q13 and Q14, which are cascode-connected between the power supply terminal VDD and the node N1, operate so as to equivalently increase the size (drive capability) of the p-channel MOS transistor Q6 of the differential amplifier output portion, which shifts the potential of the node N1 to a power supply voltage VDD side.

The first and second driver control signals IN1 and IN2 respectively control the n-channel MOS transistor Q12 and the p-channel MOS transistor Q14, and serves to changes over the size of the transistors Q8 and Q6 that form the differential amplifier output portion.

Figure 2:
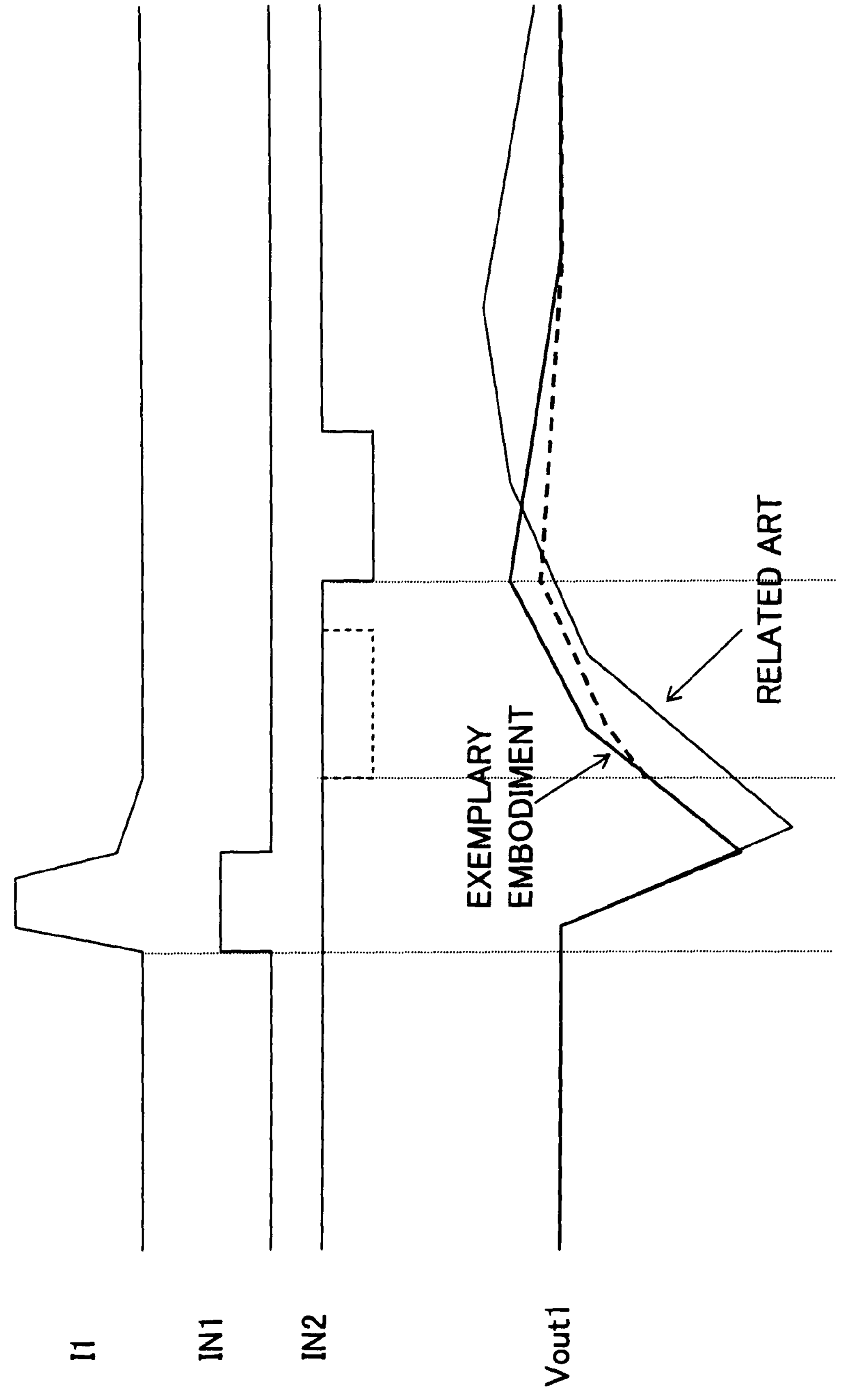
FIG. 2 is a timing waveform diagram describing operation of the first exemplary embodiment of the regulator of the present invention.

FIG. 2 is a waveform diagram for illustrating operation of FIG. 1. In FIG. 2, a current waveform (transient change) of a load current I1 of FIG. 1, a voltage waveform of the first and second driver control signals IN1 and IN2, and a waveform of the output voltage Vout1 of the regulator are shown.

Referring to FIG. 2, when the load current I1 is not flowing (default situation), both the first and the second driver control signals IN1 and IN2 are inactive (IN1 is Low, and IN2 is High), and both the transistors Q12 and Q14 in FIG. 1 are set to an off state. Therefore, the transistors Q11 and Q13 are in an off state. At this time, the potential of the gate node N1 of the drive transistor Q10 is controlled based on output (Q6 and Q8) of the output portion of the differential amplifier.

When the load is operated and the load current I1 flows, the outpour voltage Vout1 of the regulator drops. At this time, to promptly restore the output potential Vout1 to an expected value, it is necessary to shift the potential of the gate node N1 of the drive transistor Q10 to the GND potential side, and to promptly increase current supply capability of the regulator.

In the present exemplary embodiment, with the first driver control signal IN1 High, the n-channel MOS transistor Q12 is turned on, the size of the output portion of the differential amplifier is increased from the n-channel MOS transistor Q8 to a total of the n-channel MOS transistors Q8 and Q11, the current drive capability is raised, and the node N1 is shifted to the GND potential side. In this way, the current supply capability of the buffer circuit (drive transistor Q10) of the regulator is promptly increased. At this time, since the second driver control signal IN2 is High, and the p-channel MOS transistor Q14 is in an off state, there is no current supply (charging) from the p-channel MOS transistor Q13 to the node N1.

Although there is no particular limitation, when the load current I1 decreases, the first driver control signal IN1 is set to Low and the n-channel MOS transistor Q12 is turned off. The node N1 is discharged to GND potential by only the n-channel MOS transistor Q8. As a result, slew-rate of falling of the node N1 to the GND potential is lowered. The slew-rate of rising of the output voltage Vout1 of the regulator to the power supply potential VDD side also is lowered.

In FIG. 2, an output voltage waveform indicated by "related art" is an output voltage waveform of the regulator of FIG. 10.

From FIG. 2, it is understood that a response characteristic of the output voltage Vout1 (indicated by the exemplary embodiment) of the regulator of the present exemplary embodiment surpasses a response characteristic of the related art.

If the n-channel MOS transistor Q12 is removed and there is only the n-channel MOS transistor Q11 that has a gate connected with a gate of the n-channel MOS transistor Q8 between the node N11 and GND, the node N1 is discharged by the n-channel MOS transistors Q8 and Q11 and pulling down of the node N1 to a GND potential is fastened. However, there are cases where over-drive occurs due to excess current supply from the drive transistor Q10 to the load. In such cases, it takes more time for the output voltage to become stable.

In the present exemplary embodiment, the n-channel MOS transistor Q11 that has a gate connected with a gate of the n-channel MOS transistor Q8, and the n-channel MOS transistor Q12 that has a gate supplied with the first driver control signal IN1, are cascode-connected. The n-channel MOS transistor Q12 operates to limit sink current from the node N1 by the n-channel MOS transistor Q11. As a result, the occurrence of over-drive due to excess current supply to the load by the drive transistor Q10 is suppressed.

If the load current I1 ceases to flow, it is necessary to shift the node N1 to the power supply potential VDD in order to promptly transition supply capability of the regulator to an equilibrium state. Consequently, in the present exemplary embodiment, the second driver control signal IN2 is set to Low, the p-channel MOS transistor Q14 is turned on, the transistor size of the output portion of the differential amplifier is increased from the p-channel MOS transistor Q6 to a total of the p-channel MOS transistors Q6 and Q13, and the node N1 transitions easily to the power supply potential VDD side. When the second driver control signal IN2 is Low and the node N1 shifts to the power supply potential VDD side, the current supply to the load of the drive transistor Q10 decreases, and the output voltage Vout1 is lowered towards the reference voltage Vref.

When the second driver control signal IN2 is Low, since the first driver control signal IN1 is Low and the n-channel MOS transistor Q12 is turned off, there is no current dissipation from the n-channel MOS transistor Q11.

If the p-channel MOS transistor Q14 is removed, and there is only the p-channel MOS transistor Q13 that has a gate connected to a gate of the p-channel MOS transistor Q, the pulling up of the node N1 to the power supply potential VDD side is fastened, and current supply from the drive transistor Q10 to the load becomes too small. As a result, output voltage drops more than necessary, and time until the output voltage becomes stabile is elongated.

In the present exemplary embodiment, the p-channel MOS transistor Q13 that has a gate connected to a gate of the p-channel MOS transistor Q6, and the p-channel MOS transistor Q14 that has a gate supplied with the second driver control signal IN2, are cascode-connected between the node N1 and the power supply terminal VDD. The p-channel MOS transistor Q14 limits current supply to the node N1 from the p-channel MOS transistor Q13. As a result, the current supply from the drive transistor Q10 becomes too small, and the occurrence of a state in which the output voltage Vout1 drops is suppressed.

In FIG. 2, the second driver control signal IN2 may be set to a Low level at timing indicated by a broken line earlier than timing indicated by the solid line and may. When the first driver control signal IN1 goes from High to Low, the n-channel MOS transistor Q12 turns off, and a charge of the node N1 is discharged to a GND potential by only the n-channel MOS transistor Q8. When the second driver control signal IN2 is set to a Low level at a timing indicated by the broken line, the p-channel MOS transistor Q14 turns on, and according to a difference potential between the output voltage Vout1 and the reference voltage Vref, the node N1 is discharged by the n-channel MOS transistor Q8 and also is charged by the p-channel MOS transistor Q13. The slew-rate of falling of the node N1 to the GND potential is lowered. As a result, the slew-rate of rising of the output voltage Vout1 of the regulator to the power supply potential VDD is also reduced. However, in this case, the response characteristic of the output voltage of the regulator to the increase in load current is at a higher speed than the related art.

The resistance element R1 between the node N2 and GND may be replaced by a current source transistor. That is, a replacement may be made with an n-channel MOS transistor that has a source connected to GND, has a drain connected to the node N2, and has a gate connected to a bias voltage terminal. This n-channel MOS transistor composes a current source in order that a current (idling current) of an appropriate amount flows in the drive transistor Q10 even when the load current I1 becomes particularly small. Such a configuration is also possible in which that a p-channel MOS transistor (control transistor) that has a source connected to the power supply terminal VDD, has a gate connected to a bias voltage terminal, and has a drain connected to the node N1. This control transistor performs switching control of the gate bias voltage BN of the current source transistor Q9 to 0V, for example, when operation of the regulator is stopped, in synchronization therewith to cut off the drive transistor Q10.

Figure 3:
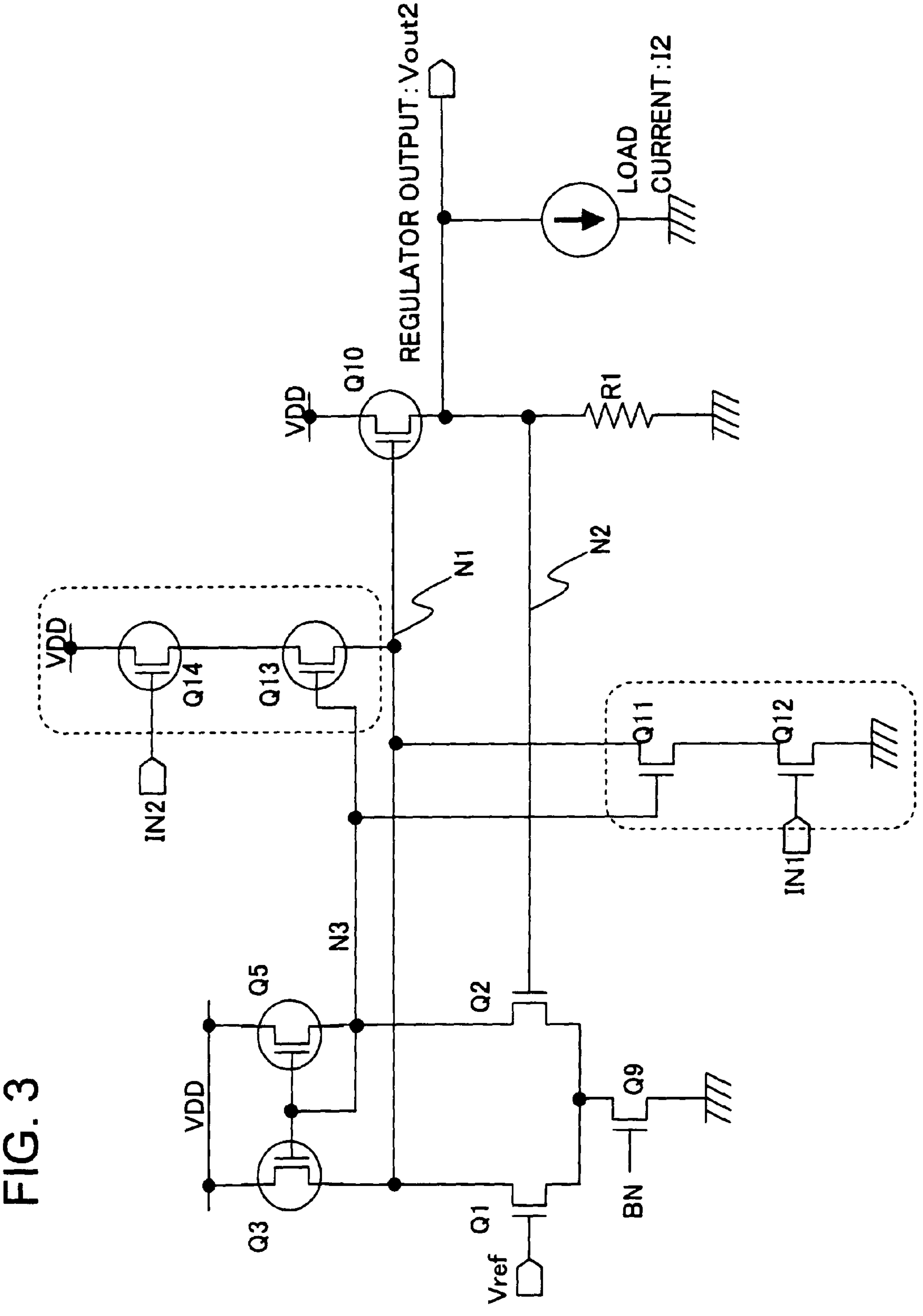
FIG. 3 is a diagram showing a configuration of a second exemplary embodiment of a regulator of the present invention.

FIG. 3 is a diagram showing a configuration of a regulator of a second exemplary embodiment of the present invention. In the present exemplary embodiment, a differential amplifier of the abovementioned first exemplary embodiment, which has a differential input stage and push-pull type output portion of a current mirror configuration, shown in FIG. 1, is substituted for a configuration in which only the differential input stage is provided.

Referring to FIG. 3, in the present exemplary embodiment, the differential amplifier includes:

a current source transistor Q9 that has a source connected to GND and has a gate to which a bias voltage BN is supplied;

a differential pair including n-channel MOS transistors Q1 and Q2, that have sources coupled together and connected to a drain of the current source transistor Q9, and have gates to which a reference voltage Vref and an output voltage Vout2 are supplied respectively;

a p-channel MOS transistor Q3 that has a source connected to a power supply terminal VDD, and has a drain connected to a drain of the transistor Q1; and a p-channel MOS transistor Q5 that has a source connected to the power supply terminal VDD, has a gate and a drain coupled together and connected to a gate of the transistor Q3 and also connected to a drain of the transistor Q2.

A p-channel MOS transistor (drive transistor) Q10 that has a source connected to the power supply terminal VDD and has a drain connected to the node N2 and has a gate connected to a connection node (one of differential outputs of the differential input stage) of a drain of the n-channel MOS transistor Q1 constituting a differential pair, and a drain of the p-channel MOS transistor Q3 constituting a load element.

The regulator according to the present exemplary embodiment includes:

p-channel MOS transistors Q13 and Q14 that are cascode-connected between the power supply terminal VDD and a gate node N1 of the drive transistor Q10, and n-channel MOS transistors Q12 and Q11 that are cascode-connected between GND and the gate node N1 of the drive transistor Q10. A first driver control signal IN1 is supplied to a gate of the n-channel MOS transistor Q12. A second driver control signal IN2 is supplied to a gate of the p-channel MOS transistor Q14.

The n-channel MOS transistor Q11 and the p-channel MOS transistor Q13 have gates connected in common to the drain of the n-channel MOS transistor Q2 constituting the differential pair, and a node N3 (the other of the differential outputs of the differential input stage), which is a connection node of the drain and gate of the p-channel MOS transistor Q5 constituting the load element.

In the present exemplary embodiment, in a default situation, the first and second driver control signals IN1 and IN2 are both set to be inactive, and the transistors Q12 and Q14 are turned off. A potential of the gate node N1 of the drive transistor Q10 is controlled by output of the differential amplifier (output of the transistor Q1).

When a load current I2 flows, and an output potential Vout2 drops, in order to restore the output voltage Vout2 promptly to an expected value, it is necessary to shift the gate node N1 of the drive transistor Q10 to a GND potential, and to promptly increase current supply capability of the regulator.

By activating the first driver control signal IN1, the size of the n-channel MOS transistor Q1 constituting the differential pair, is equivalently enlarged to the n-channel MOS transistor Q1 plus Q11, the node N1 is transitioned easily to a GND potential side, and the current supply capability from the regulator is promptly increased. At this time, the p-channel MOS transistor Q13 is turned off, and there is no current supply from the p-channel MOS transistor Q13 to the node N1. That is, since each path of the n-channel MOS transistor Q11 and the p-channel MOS transistor Q13 are not on at the same time, there is no increase in current dissipation of the regulator.

When the load current I2 ceases to flow, in order to promptly transition the current supply capability of the regulator to an equilibrium state, it is necessary to shift the node N1 to the power supply potential VDD side. At this time, in the present exemplary embodiment, the p-channel MOS transistor Q14 is turned on by the second driver control signal IN2, and hence the total driver size of the output portion of the differential amplifier is increased from the p-channel MOS transistor Q3 to that of the p-channel MOS transistors Q3 plus Q13. As a result, the node N1 transitions easily to the power supply potential VDD side.

As described above, in the regulator of the abovementioned present exemplary embodiment, the transistors Q11, Q12, Q13, and Q14, which equivalently change transistor size of the differential pair that controls a gate potential of the drive transistor Q10, based on a control signal, are provided. The speed up of a response of the regulator to the change of the regulator output load current is achieved and change in regulator output voltage is suppressed. In this way, variations in circuit operation are decreased and high speed operation is made possible.

Figure 4:
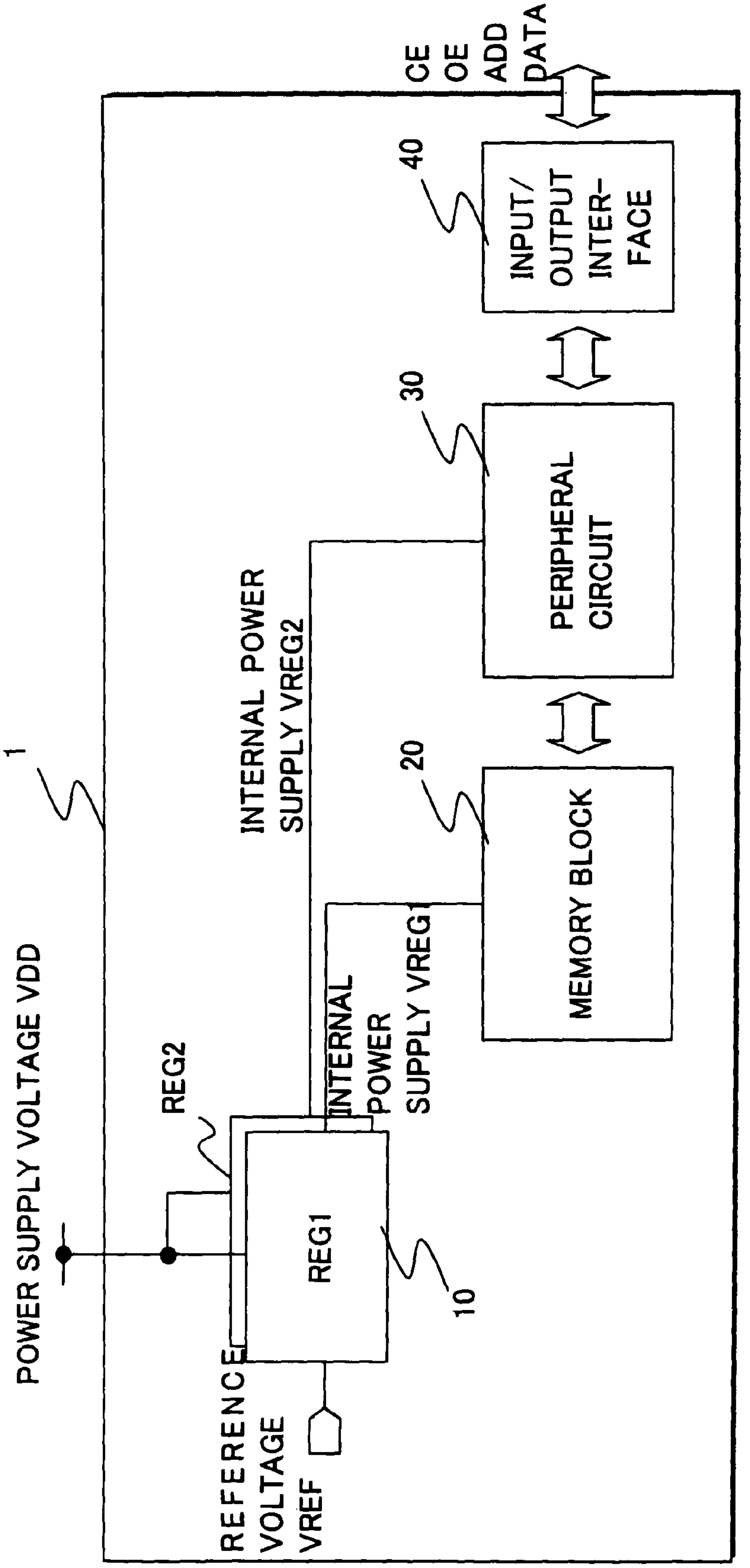
FIG. 4 is a diagram schematically showing a configuration of a semiconductor integrated circuit device provided with the regulator of the present invention.

Next, a semiconductor device including a regulator of the above described present invention will be described. FIG. 4 is a diagram showing a configuration of a semiconductor integrated circuit device including the regulator of the present exemplary embodiment. Referring to FIG. 4, the semiconductor integrated circuit device 1 includes a regulator unit (REG1 and REG2) 10, a memory block 20, a peripheral circuit 30, and an input/output interface 40. The regulator unit (REG1 and REG2) 10 includes a plurality of regulators described with reference to FIG. 1 to FIG. 3, receive the reference voltage Vref, and generate internal power supplies (VREG1 and VREG2) from the power supply voltage VDD. Although there is no particular limitation, in the example shown in FIG. 4, an internal power supply (VREG1) from the regulator (REG1) is supplied to the memory block 20, and an internal power supply (VREG2) from the regulator (REG2) is supplied to the peripheral circuit 30. The internal power supplies (VREG1 and VREG2) are at a stable level, independent of variations of the power supply voltage VDD. It should be noted that the number of regulators in the regulator unit (REG1 and REG2) is not limited to 2.

The memory block 20 includes a memory array, a decoder circuit, a sense amplifier, and a timing circuit (none of which are shown), and performs a circuit operation with the internal power supply VREG1 as a power supply.

The peripheral circuit 30 includes a control circuit that controls transfer of address and data signals between the memory array and a signal that is externally supplied to a chip, via the input/output interface 40, and various types of mode entry control circuits, and a timing circuit (none of which are shown), and performs a circuit operation with the internal power supply VREG2 as a power supply. The peripheral circuit part 30 supplies address information, memory cell data, and a sense amplifier activation signal to the memory block 20.

The input/output interface 40 is disposed between the signal externally supplied to the chip and the peripheral circuit 30, and includes buffers for address, data, and various command signals, and a level conversion circuit (none of which are shown). Although there is no particular limitation imposed on the control signals, in the example of FIG. 1, as control signals, a chip select signal CE, an output enable signal OE, and an address signal ADD are received, and data DATA is received and output.

Figure 5:
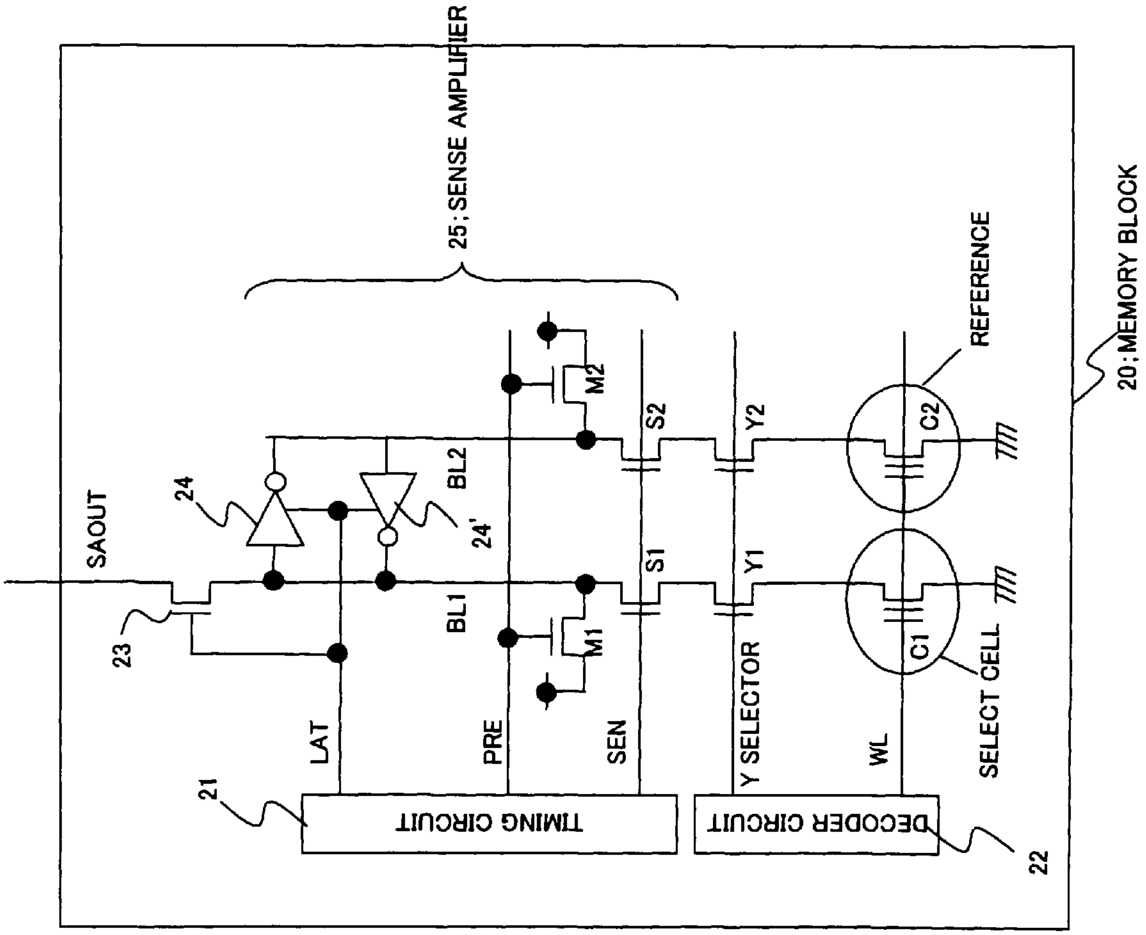
FIG. 5 is a diagram showing one example of a configuration of a memory block part of FIG. 4.

FIG. 5 is a diagram showing a configuration of the memory block 20 of FIG. 4. Referring to FIG. 5, the memory block 20 includes a memory cell (although there is no limitation imposed on the memory cell, in this example, the memory cell may be an EEPROM (Electrically Erasable Programmable Read Only Memory) cell, such as Flash Memory, or the like), a timing circuit 21, a decoder circuit 22, and a sense amplifier 25. In FIG. 5, only for simplicity's sake, one cell (C1) that is selected (termed select cell) is shown as the memory cell, and a reference cell (dummy cell) C2, which gives a bit line reference voltage, is shown.

The decoder circuit 22 decodes the address information to select the memory cell by a generated signal. In FIG. 5, the decoder circuit 22 includes an X decoder (not shown) that decodes an X address (row address) of the address information and selects a word line WL, and a Y decoder (not shown) that decodes a Y address (column address) of the address information and outputs a Y selector (column select signal) that selects a Y switch (column switch).

A bit line BL1 selected by a Y switch (Y1, Y2), out of bit lines of the memory array, and a bit line BL2 that is a reference, are connected to the sense amplifier 25. In FIG. 2, only for simplicity's sake, among plural bit lines of the memory array, only a bit line connected to the select cell C1 and a bit line connected to the reference cell C2 are shown.

The timing circuit 21 generates a precharge signal PRE, a sensing signal (sense enable signal) SEN, and a sense latch signal LAT, from the sense amplifier activation signal received from the peripheral circuit 30 to supply the so generated signal to a bit line BL precharge circuit and the sense amplifier 25.

The bit line BL precharge circuit includes: an n-channel MOS transistor M1 that is connected between a precharge power supply terminal and a bit line BL1 and that has a gate to which the precharge signal PRE is supplied; and an n-channel MOS transistor M2 that is connected between the precharge power supply terminal and the bit line BL2, and that has a gate to which the precharge signal PRE is supplied.

The sense amplifier 25 includes: switches (pass transistors) S1 and S2 that have gates to which a sensing signal (sense enable signal) SEN is supplied and that connect one ends of Y switches Y1 and Y2 to bit lines BL1 and BL2 on a sense amplifier 25 side; and clocked inverters 24 and 24' which have inputs and outputs mutually connected, and activation and deactivation of which are controlled by the sense latch signal LAT. The input and output of the clocked inverter 24 (the output and input of the clocked inverter 24') are connected respectively to the bit lines BL1 and BL2 of the sense amplifier 25 side. A connection node of the input of the clocked inverter 24 and the output of the clocked inverter 24' is connected to a sense amplifier output SAOUT via an n-channel MOS transistor (pass transistor) that is on-off controlled by a sense latch signal LAT.

A reference C2 constitutes a True/Bar relationship with the select cell C1, and is composed by a reference cell that is set to a fixed threshold, a reference transistor, or the like. In the example of FIG. 5, a reference is composed by the reference cell C2.

Figure 6:
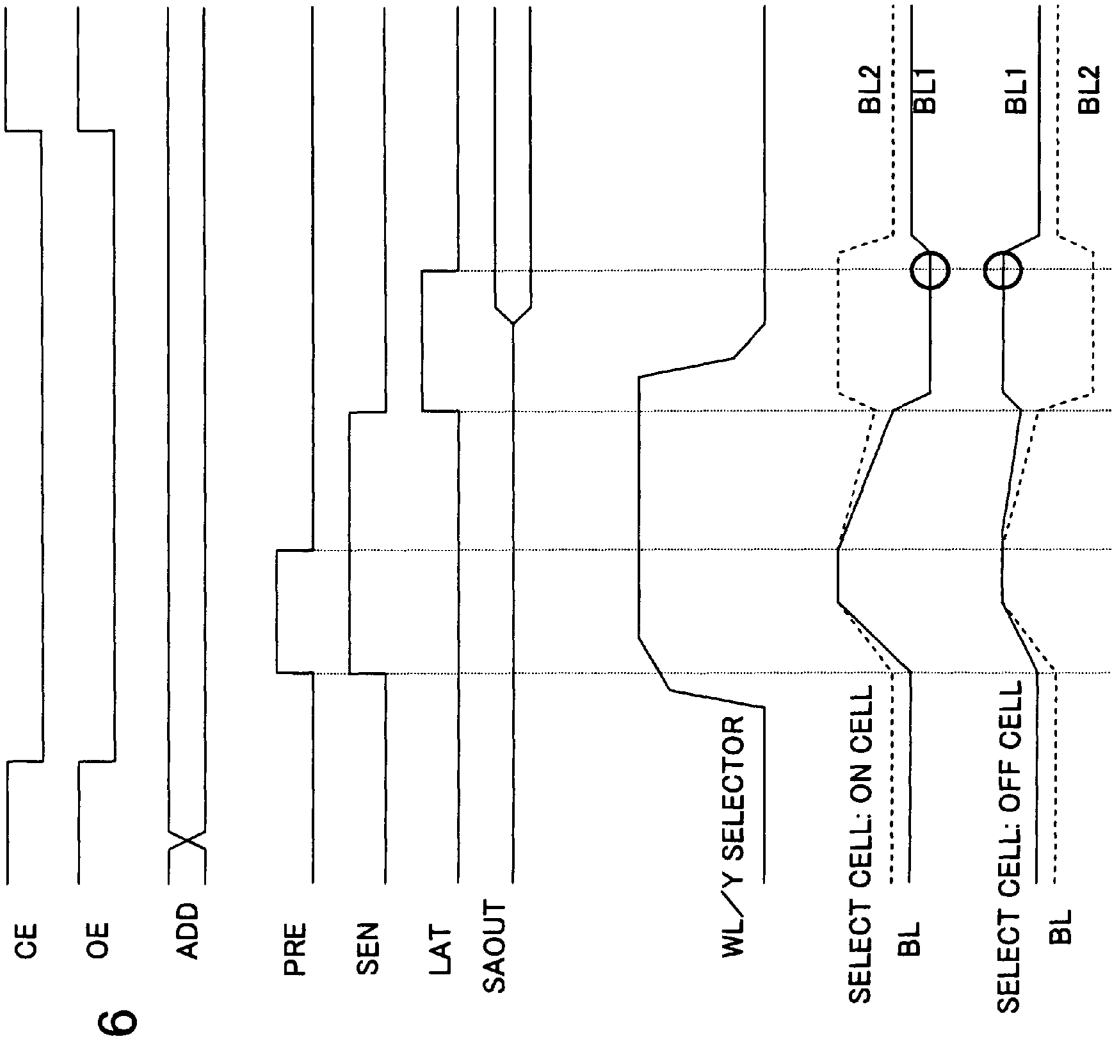
FIG. 6 is a timing waveform diagram for describing operation of FIG. 5.

FIG. 6 is a timing waveform diagram showing an operation when READ is performed, with regard to FIG. 5. In FIG. 6, voltage waveforms of each of a chip enable signal CE, an output enable signal OE, an address signal ADD, a precharge signal PRE, a sensing signal SEN, a sense latch signal LAT, a word line/Y switch, and a bit line BL when the select cell is on and when the select cell is off, are shown.

The chip enable signal CE and the output enable signal OE are activated (both are activated at a Low level) and are supplied to the peripheral circuit 30 together with an external address signal ADD, via an input/output interface 40.

The peripheral circuit part 30 recognizes a READ mode, from values of the chip enable signal CE and the output enable signal OE, and sends address information and the sense amplifier activation signal (not shown in FIG. 3) to the memory block 20 at a preset timing.

A word line WL of the select cell C1 and the reference C2, and Y selectors Y1 and Y2 are selected by the decoder circuit 22, and the word line WL and the Y selectors rise to a High level. At almost the same timing, the peripheral circuit 30 activates the sensing signal SEN and the precharge signal PRE, and precharging to a High potential of the bit lines BL1 and BL2 is started.

Next, the precharge signal PRE becomes inactive (Low), and the transistors M1 and M2 of the precharge circuit are in an off state. When the precharging of the bit lines BL1 and BL2 is completed, the bit line BL2 of the reference cell C2 is discharged to a GND potential side at a constant rate.

When the select cell C1 is an on cell (current path between the bit line and GND is on), the bit line BL1 of the select cell C1 (solid line of select cell: on cell in FIG. 6) is discharged to a GND side faster than the bit line BL2 of the reference cell C2 (broken line of select cell: on cell in FIG. 6).

When the select cell C1 is an on cell, the bit line BL1 of the select cell C1 (solid line of select cell: off cell in FIG. 6) is discharged to a GND side slower than the bit line BL2 of the reference cell C2 (broken line of select cell: off cell in FIG. 6).

At timing at which a potential difference of the bit lines BL1 and BL2 is developed to a certain extent (for example, 20 mV to 50 mV), the latch signal LAT is activated, and an output signal (output of the inverter 24') from a flip-flop including the inverters 24 and 24' is outputted as SAOUT. At a time point of transition of the latch signal LAT from Low to High, the sensing signal SEN is made inactive (Low), the switches S1 and S2 are set in an off state, and the bit lines BL1 and BL2 of the sense amplifier 25 side are cut off from a bit line on a memory array side. As a result, a cell-directed leakage path is no longer present. At this time, the word line WL and the Y selectors are both inactive.

When the latch signal LAT is active (a High pulse period of LAT in FIG. 6), the sense amplifier 25, in a state cut off from the bit lines of the memory array side, latches the bit lines BL1 and BL2 to perform differential output (one of the bit lines BL1 and BL2 is High, and the other is Low). In case that the cell C1 connected to the bit line B11 is an on cell, a value 0 is outputted to SAOUT, when the latch signal LAT is active. In case that the cell C1 is an off cell, a value 1 is outputted to SAOUT, when the latch signal LAT is active.

When the latch signal LAT goes from an active state (High) to an inactive state (Low), a sensing operation in the sense amplifier 25 is completed, and SAOUT maintains a latched state (refer to circle mark of BL in FIG. 6). When the latch signal LAT is inactive and the pass transistor 23 is off, data read the previous time is held in SAOUT, and when the latch signal LAT is active and the pass transistor 23 is on, data read this time is delivered to SAOUT. SAOUT is output as DATA outside a chip via a peripheral circuit PERI and an input/output interface.

Figure 7:
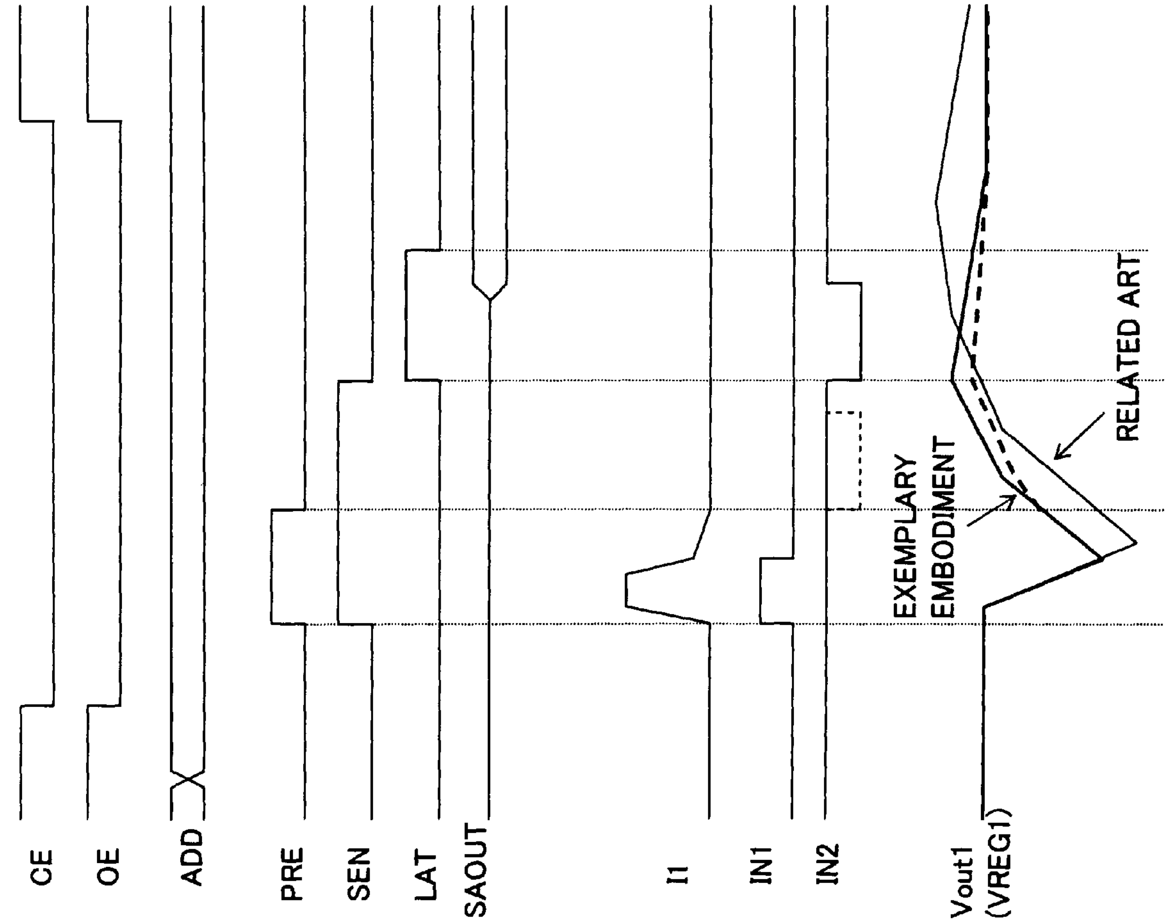
FIG. 7 is a timing waveform diagram describing operation of an exemplary embodiment of the present invention.

FIG. 7 is a waveform diagram for describing a READ operation of the memory block 20 in which the regulator described with reference to FIG. 1 is used in the regulator unit 10 of FIG. 4. FIG. 7 shows timing operation of waveforms shown in FIG. 6 (CE, OE, ADD, PRE, SEN, LAT, and SAOUT) and waveforms of FIG. 2 (I1, IN1, IN2, and Vout1).

The sensing signal SEN and the precharge signal PRE are set to High by the peripheral circuit 30, and in the memory block 20, when the precharging of the bit lines BL1 and BL2 is started, the output load current of the regulator unit (REG1) 10 increases. In the present exemplary embodiment, when the sensing signal SEN and the precharge signal PRE become High, the first driver control signal IN1 is set to High, and potential of the gate node N1 of the drive transistor Q10 is pulled down to a GND potential side, and current supply capability to the load of the drive transistor Q10 is raised, by the co-operation of the n-channel MOS transistors Q8 and Q11 of FIG. 1. When the sensing signal SEN becomes inactive (Low), the second driver control signal IN2 is set to Low, and potential of the gate node N1 of the drive transistor Q10 is pulled up to the power supply voltage VDD side, and current supply capability to the load of the drive transistor Q10 is lowered by the cooperation of the p-channel MOS transistors Q6 and Q13 of FIG. 1, and the output voltage Vout1 decreases and approaches the reference voltage Vref. In FIG. 7, the output voltage Vout1 indicated by the "related art" is the output voltage of related art of FIG. 10, response to increase of the load current I1 is slow. After the output voltage rises due to current supply increase of the drive transistor Q10 at the time of the increase of the load current I1, time until the output voltage falls to the reference voltage is also slow.

In FIG. 7, the first driver control signal IN1 rises to High at timing of increasing of the precharge signal PRE to High, and is set to Low before falling of the precharge signal PRE to Low, and an active period of the first driver control signal IN1 (a High period) is an optional time from starting the precharging. Since forced driving does not occur, only a little overdrive due to unnecessary excess supply is needed.

When the precharging is completed, the load current is no longer present. In order to promptly transition the current supply capability of the regulator to an equilibrium state, it is necessary to shift the node N1 to the power supply potential VDD side. Accordingly, the p-channel MOS transistor Q14 is turned on, by the second driver control signal IN2, the total driver size of the output portion of the differential amplifier is increased from the p-channel MOS transistor Q6 to that of the p-channel MOS transistors Q6 plus Q13, and the node N1 transitions easily to the VDD side. At this time, there is no current dissipation from the n-channel MOS transistor Q12.

The active period (High period) of the second driver control signal IN2 starts with start of a sense latch operation (rising edge of the latch signal LAT) or end of precharge (falling edge of the precharge signal PRE; refer to broken line for IN2 in FIG. 7), as a trigger, and this time period is arbitrary. Since forced driving does not occur, there is no Vout2 drop due to an unnecessarily small supply.

Figure 8:
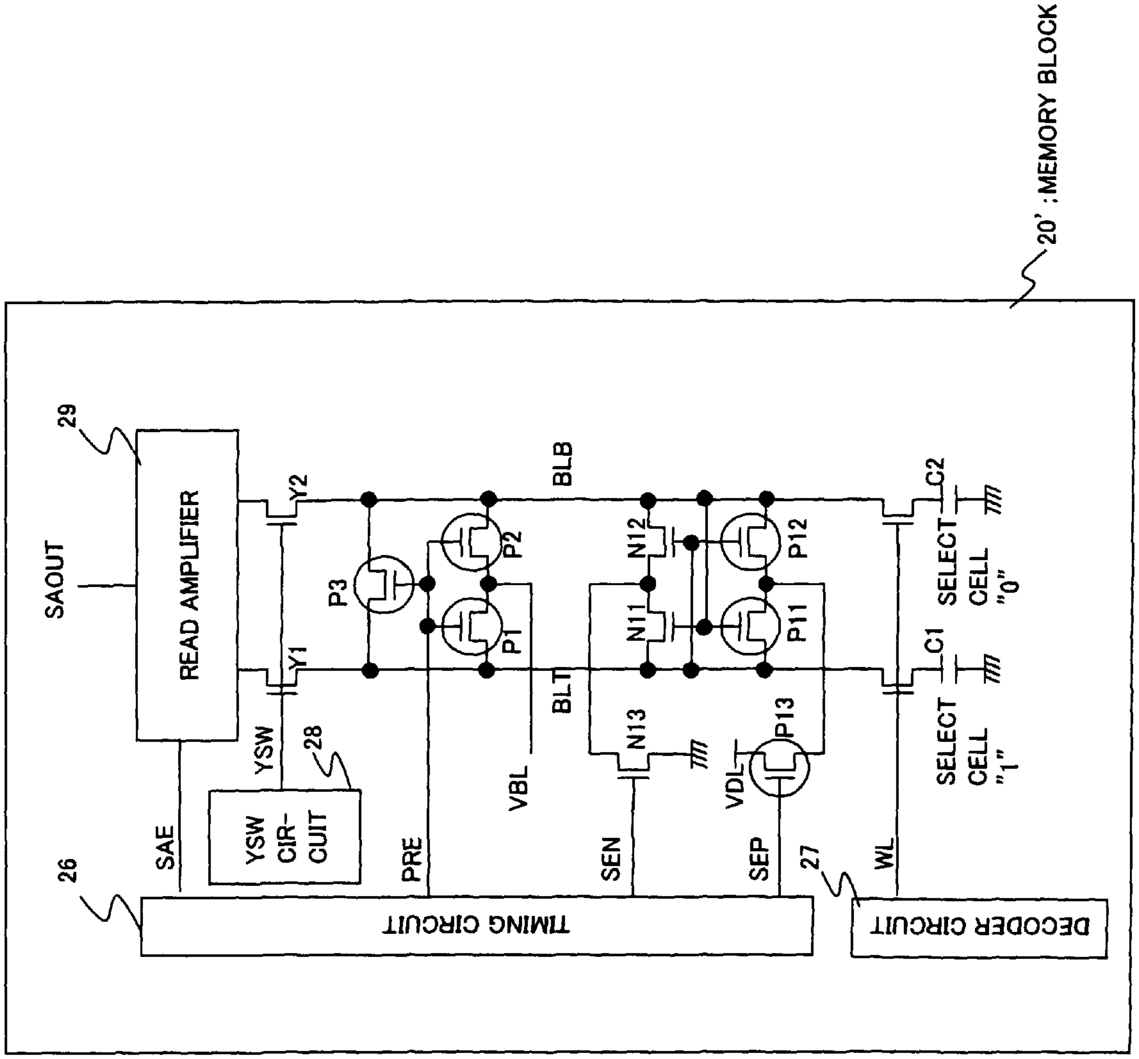
FIG. 8 is a diagram showing another configuration example of the memory block part of FIG. 4.

FIG. 8 is a diagram showing another configuration example of the memory block 20 of FIG. 4. In FIG. 5, a configuration was shown of an EEPROM cell such as a Flash cell or the like. The memory block 20' of FIG. 8 includes a DRAM (Dynamic random Access Memory) cell that requires a refresh operation for data retention. In the memory block 20' a decoder circuit 27 decodes a row address and activates a selected word line WL.

The sense amplifier includes n-channel MOS transistors N11 and N12 connected in series between the bit line pair BLT and BLB, and the p-channel MOS transistors P11 and P12 connected in series between the bit line pair BLT and BLB. The gate of the n-channel MOS transistor N11 and the gate of the p-channel MOS transistor P11 are connected in common to the bit line BLB, and the gate of the n-channel MOS transistor N12 and the gate of the p-channel MOS transistor P12 are connected in common to the bit line BLT. The n-channel MOS transistor N13 that receives the sense signal SEN from the timing circuit 21 at a gate thereof is connected between GND and a connection node of the n-channel MOS transistors N11 and N12.

The p-channel MOS transistor P13 that receives a sense signal SEP from the timing circuit 26 at a gate thereof, is connected between a power supply VDL and a connection node of the p-channel MOS transistors P11 and P12. The sense signals SAP and SEN are supplied to the sense amplifier circuit (N11, N12, P11, P12) in order to develop a potential difference between the bit lines BLT and BLB after cell selection. That is, when SAP is High and SEN is Low, the sense amplifier circuit (N11, N12, P11, P12) operates. When the voltage of the True bit line BLT is higher than a logic threshold and the voltage of the Bar bit line BLB is lower than the logic threshold, the transistors P11 and N12 are turned on (the transistors P12 and N11 are off), and BLT and BLB are set respectively to VDL and GND potentials by the transistors P13 and N13. When the voltage of the True bit line BLT is lower than a logic threshold and the voltage of the Bar bit line BLB is higher than the logic threshold, the transistors P12 and N11 are on (the transistors P11 and N12 are off), and BLT and BLB are set respectively to GND and VDL potentials by the transistors N13 and P13.

The p-channel MOS transistors P1 and P2 that receive the precharge signal PRE from the timing circuit 26 at gates thereof, are connected in series between the bit line pair BLT and BLB. VBL is connected to a connection node of the p-channel MOS transistors P1 and P2. When the precharge signal PRE is at a Low level, p-channel MOS transistors P1 and P2 are turned on and the bit lines BLT and BLB are precharged to a voltage VBL (for example, a voltage half that of VDL). The p-channel MOS transistor P3 connected between the bit pair BLT and BLB is on when the precharge signal PRE has a Low level. The p-channel MOS transistor P3 is an equalizer for equalizing the bit line pair BLT and BLB.

A YSW (Y switch) circuit 28 decodes a column address and turns a selected Y switch on.

A read amplifier 29 is made active when a read amplifier activation signal SAE is activated, and amplifies read data received via the Y switches Y1 and Y2. A YSW signal output from the YSW circuit 28 performs selection of a column that is output to SAOUT of the read amplifier 29. In the memory block 20', a plurality of bit line pairs shown in FIG. 8 are provided. Each of the bit line pairs is connected to the read amplifier 29 via each of Y switches, and one bit line pair selected by the YSW circuit 28 is connected to the read amplifier 29.

Figure 9:
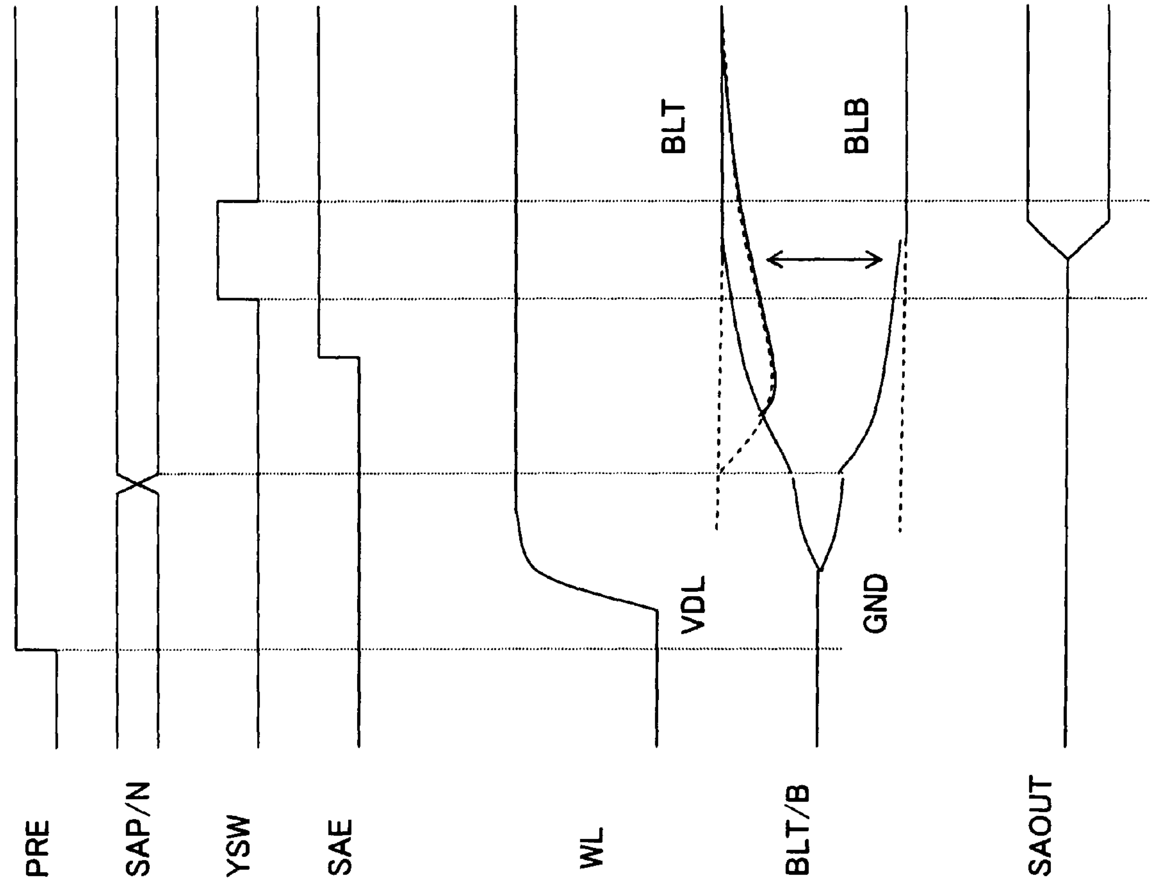
FIG. 9 is a timing waveform diagram describing operation of an exemplary embodiment of the present invention.

FIG. 9 is a timing waveform diagram showing an operation when READ is performed in a circuit of FIG. 8. In FIG. 9, voltage waveforms of precharge signal PRE, SAP/SAN, YSW, SAE, word line, BLT and BLB, and SAOUT are respectively shown.

When the precharge (equalize) signal PRE generated by the timing circuit 26 is in an active state (Low), the bit line pair BLT and BLB are precharged to a VBL potential (½ of VDL) and equalized.

When an indicated address is selected, the precharge (equalize) signal PRE is in an inactive state (High), and precharging and equalizing are stopped. At the same time, the selected word line WL is activated, and the cell transistors C1 and C2 are selected.

When the potential of the word line WL exceeds a threshold of a select cell, C1 transitions towards a higher level than a VBL level, and C2 transitions towards a lower level than the VBL level, according to cell capacity.

The bit line pair BLT and BLB are amplified respectively to a power supply potential VDL and GND (ground) potential, by sense signals SAP and SAN. Data selected by YSW is latched by the read amplifier 29, and as SAOUT via the peripheral circuit (30 in FIG. 4) and an input/output interface (40 in FIG. 4) is output as read data to outside the chip.

The regulator according to the present invention is preferably used as a regulator for the memory block of FIG. 8. That is, when access to the memory block is started, the load current flows at an operating timing of the circuit, such as a precharge operation or the like, and output voltage drops. In order to promptly restore the output voltage drop to an expected value, it is necessary to shift the gate potential N1 of the drive transistor Q10 of FIG. 1 to a GND (ground) side, and to promptly increase current supply capability of the regulator. According to the present exemplary embodiment, the n-channel MOS transistor Q12 is turned on by the control signal IN1, thereby increasing the total driver size of the output portion of the differential amplifier from the n-channel MOS transistor Q8 to that of Q8 plus Q11 (in FIG. 3, increasing from the n-channel MOS transistor Q1 to Q1 plus Q11). By facilitating transition of the gate node N1 of the drive transistor Q10 to a GND side, the drive capability of the regulator is promptly increased. At this time, there is no current supply from the p-channel MOS transistor Q13. In an activation period (a High period) of the first driver control signal IN1, pulse adjustment is performed from activation of the sense signals SEP and SEN lasting for an optional time period. Since forced driving does not occur, only a little overdrive due to unnecessary excess supply is needed.

When the precharging is completed, the load current is no longer present. In order to promptly transition the supply capability of the regulator to an equilibrium state, it is necessary to shift the node N1 to the power supply potential VDD side. Accordingly, the p-channel MOS transistor Q14 of FIG. 1 is turned on, by the second driver control signal IN2, the total driver size of the output portion of the differential amplifier is increased from the p-channel MOS transistor Q6 to that of the p-channel MOS transistors Q6 plus Q13 (however, in FIG. 3, there is an increase from the p-channel MOS transistor Q3 to that of Q3 plus Q13), and the node N1 transitions easily to the VDD side. At this time, there is no current dissipation from the n-channel MOS transistor Q12. In an activation period (a High period) of the second driver control signal IN2, pulse adjustment is performed from the start of activation of the read amplifier 29 or inactivation of the first driver control signal IN1, as a trigger, lasting for an optional time period. Since forced driving does not occur, there is no Vout2 drop due to an unnecessarily small supply.

According to the present invention, even in a case where the load current of the regulator output has increased, by suppressing variation of the regulator output voltage, it is possible to decrease variation in circuit operation and have high speed access.

In the various abovementioned exemplary embodiments, a DRAM cell or EEPROM cell, such as a FLASH cell and so forth, have been used as examples. ROM, SRAM (Static Random Access Memory) and so forth are also possible.

Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A regulator comprising:

a differential amplifier including a differential input stage that differentially receives a reference voltage and an output terminal voltage of the regulator;

a drive transistor that has an output connected to an output terminal of the regulator and that has a control terminal connected to an output of the differential amplifier;

first and second transistors connected in series between the control terminal of the drive transistor and a first power supply terminal; and third and fourth transistors connected in series between the control terminal of the drive transistor and a second power supply terminal, wherein a control terminal of the first transistor and a control terminal of the third transistor are directly or indirectly connected to outputs of the differential input stage, and a control terminal of the second transistor and a control terminal of the fourth transistor are connected to a first control signal and a second control signal, respectively, the second control signal being on-off controlled by the first control signal and the fourth transistor being on-off controlled by the second transistor.

2. The regulator according to claim 1, wherein a voltage at the control terminal of the drive transistor is controlled, based on the first and the second control signals, by one of the following:

(a) the output of the differential amplifier;

(b) the output of the differential amplifier and the first transistor; and (c) the output of the differential amplifier and the third transistor.

3. The regulator according to claim 1, wherein when the first control signal is activated and the second control signal is deactivated, the second transistor is turned on and the fourth transistor is turned off, and a voltage at the control terminal voltage of the drive transistor is changed to the first power supply voltage side by the output of the differential amplifier and the first transistor, and wherein when the second control signal is activated and the first control signal is deactivated, the fourth transistor is turned on and the second transistor is turned off, and a voltage at the control terminal voltage of the drive transistor is changed to the second power supply voltage side by the output of the differential amplifier and the third transistor.

4. The regulator according to claim 1, wherein the differential amplifier comprises a differential amplifier output portion of a push-pull configuration including a first and a second current mirror that receive as inputs respective currents at first and second outputs of differential outputs of the differential input stage and output respective mirror currents, wherein the control terminals of the first transistor and the third transistor are connected to control terminals of two transistors of the push-pull configuration, respectively, and the control terminal of the drive transistor is connected to a connection node of outputs of the two transistors of the push-pull configuration.

5. The regulator according to claim 1, wherein the differential input stage of the differential amplifier comprises:

a differential pair; and a current source that supplies a current to the differential pair, the differential pair including:

a transistor pair that differentially receives the reference voltage and the output terminal voltage of the regulator; and a load circuit of the differential pair, and wherein the output portion of the differential amplifier comprises first to third current mirror circuits, a transistor on an input side of the first current mirror circuit forming the load circuit for a first output of differential outputs of the differential pair, a transistor on an input side of the second current mirror circuit forming the load circuit for a second output of differential outputs of the differential pair, the third current mirror circuit receiving an output current of the second current mirror circuit, a transistor on an output side of the first current mirror circuit and a transistor on an output side of the third current mirror circuit forming push-pull transistors, and the control terminal of the drive transistor being connected to a connection node of the transistor on an output side of the first current mirror circuit and the transistor on an output side of the third current mirror circuit.

6. The regulator according to claim 1, wherein the differential input stage of the differential amplifier comprises:

a differential pair; and a current source that supplies a current to the differential pair, the differential pair including:

a transistor pair that differentially receives the reference voltage and the output terminal voltage; and a load circuit of the differential pair, wherein the control terminal of the drive transistor is connected to a first output of differential outputs of the differential input stage, the first output forming the output of the differential amplifier, and the control terminal of the first transistor and the control terminal of the third transistor are connected in common to a second output of the differential outputs of the differential input stage.

7. A semiconductor device comprising the regulator according to claim 1.

8. The semiconductor device according to claim 7, comprising:

one or a plurality of circuit blocks; and one or plurality of the regulators corresponding to the one or a plurality of circuit blocks, each of the one or plurality of the regulators supplying a power supply voltage to an associated circuit block of the one or the plurality of circuit blocks.

9. The semiconductor device according to claim 8, wherein at least one of the circuit blocks comprises a memory block.

10. The semiconductor device according to claim 8, wherein at least one of the circuit blocks comprises a flash memory.

11. The semiconductor device according to claim 8, wherein at least one of the circuit blocks comprise a dynamic random access memory.

* * * * *